(12) United States Patent
Yong et al.

(10) Patent No.: US 8,981,408 B2
(45) Date of Patent: Mar. 17, 2015

(54) LIGHT SOURCE HAVING LIQUID ENCAPSULANT

(71) Applicant: Avago Technologies General IP (Singapore) Pte. Ltd., Singapore (SG)

(72) Inventors: Lig Yi Yong, Penang (MY); Keat Chuan Ng, Penang (MY); Choon Guan Ko, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 52 days.

(21) Appl. No.: 13/952,060

(22) Filed: Jul. 26, 2013

(65) Prior Publication Data

US 2015/0028370 A1    Jan. 29, 2015

(51) Int. Cl.
*H01L 33/00*    (2010.01)
*H01L 33/54*    (2010.01)
*H01L 33/58*    (2010.01)

(52) U.S. Cl.
CPC .............. *H01L 33/54* (2013.01); *H01L 33/58* (2013.01)
USPC ......................................................... 257/98

(58) Field of Classification Search
CPC .................................................... H01L 33/52
See application file for complete search history.

(56) References Cited

U.S. PATENT DOCUMENTS

| | | | |
|---|---|---|---|
| 8,202,933 B2 | 6/2012 | Miyawaki et al. | |
| 8,338,842 B2 * | 12/2012 | Lerman et al. | 257/88 |
| 2007/0216297 A1 | 9/2007 | Leng et al. | |
| 2009/0309116 A1 | 12/2009 | Kato et al. | |
| 2012/0033440 A1 | 2/2012 | Wheelock et al. | |
| 2012/0074452 A1 | 3/2012 | Chan et al. | |
| 2012/0256220 A1 | 10/2012 | Katayama et al. | |
| 2012/0273976 A1 | 11/2012 | David et al. | |
| 2013/0161658 A1 * | 6/2013 | Lin et al. | 257/88 |

FOREIGN PATENT DOCUMENTS

| | | |
|---|---|---|
| CN | 202275866 | 6/2012 |
| WO | WO 2013/056173 | 4/2013 |

* cited by examiner

*Primary Examiner* — Lex Malsawma (57) ABSTRACT

In one embodiment, a light source comprising a substrate, a die, a liquid encapsulant, an attachment member and a resilient cover configured to hold the liquid encapsulant is disclosed. At least a portion of the resilient cover is easily stretchable so as to absorb size increment of the liquid encapsulant due to thermal expansion. One other embodiment discloses a light-emitting device comprising a die, a liquid encapsulant and the resilient cover. The resilient cover may comprise a dome shaped portion, a vertical portion and a thermal joint portion. In another embodiment, a lighting apparatus having similar resilient cover is disclosed. The resilient cover may further comprise a thermal joint portion having first and second indentations for absorbing thermal expansion.

20 Claims, 12 Drawing Sheets

LIGHT SOURCE HAVING LIQUID ENCAPSULANT

BACKGROUND

A light-emitting diode (referred to hereinafter as LED) represents one of the most popular light-emitting devices today. In recent years, the luminous efficacy of LEDs, defined in lumens per Watt, has increased significantly from 20 lumens per Watt (approximately the luminous efficacy of an incandescent light bulb) to over 400 lumens per Watt, which greatly exceeds the luminous efficacy of a fluorescent light at 60 lumens per Watt. In other words, for a fixed amount of light output, LEDs consume approximately one sixth of the power compared to fluorescent lights, and almost negligibly small compared to incandescent light bulbs. Accordingly, it is not surprising today that lighting fixtures with LEDs have been replacing incandescent light bulbs and fluorescent light tubes. A new term "Solid-State Lighting" has been created. The term "Solid-State Lighting" refers to the type of lighting that uses semiconductor light-emitting diodes, such as an LED rather than traditional light sources.

Generally, LEDs are more expensive than conventional light sources. However, high reliability and low power consumption may be the main reasons for LEDs adoption in lighting. For example, LEDs are popular as light sources in warehouses, gasoline stations, and streetlights where replacement of the light sources would incur maintenance cost compared to the traditional light sources. In addition, savings from the low power consumption of the LEDs may justify the cost of the LEDs. For example, the power consumption of the LEDs may be less than 50% compared to conventional light sources and accordingly, the cost savings from long period of use may be more than the cost for the LEDs. Therefore, the reliability requirement for LEDs is generally high. Most LEDs are expected to be operable for more than 60,000 hours compared to less than 20,000 hours for conventional light sources such as fluorescent light tubes.

Like any other light sources, LEDs may produce heat and over long period of time, thermal expansion from the heat generated by the LEDs may stress the LEDs. In order to prolong the reliability of such LED lighting device, heat dissipating fins may be required. Installation of heat dissipating fins may increase the cost of the lighting devices. In addition, the requirement of heat dissipating fins may add weight to the lighting devices.

BRIEF DESCRIPTION OF THE DRAWINGS

Illustrative embodiments by way of examples, not by way of limitation, are illustrated in the drawings. The drawings may not be drawn per actual scale. Throughout the description and drawings, similar reference numbers may be used to identify similar elements.

DETAILED DESCRIPTION

Figure 1:
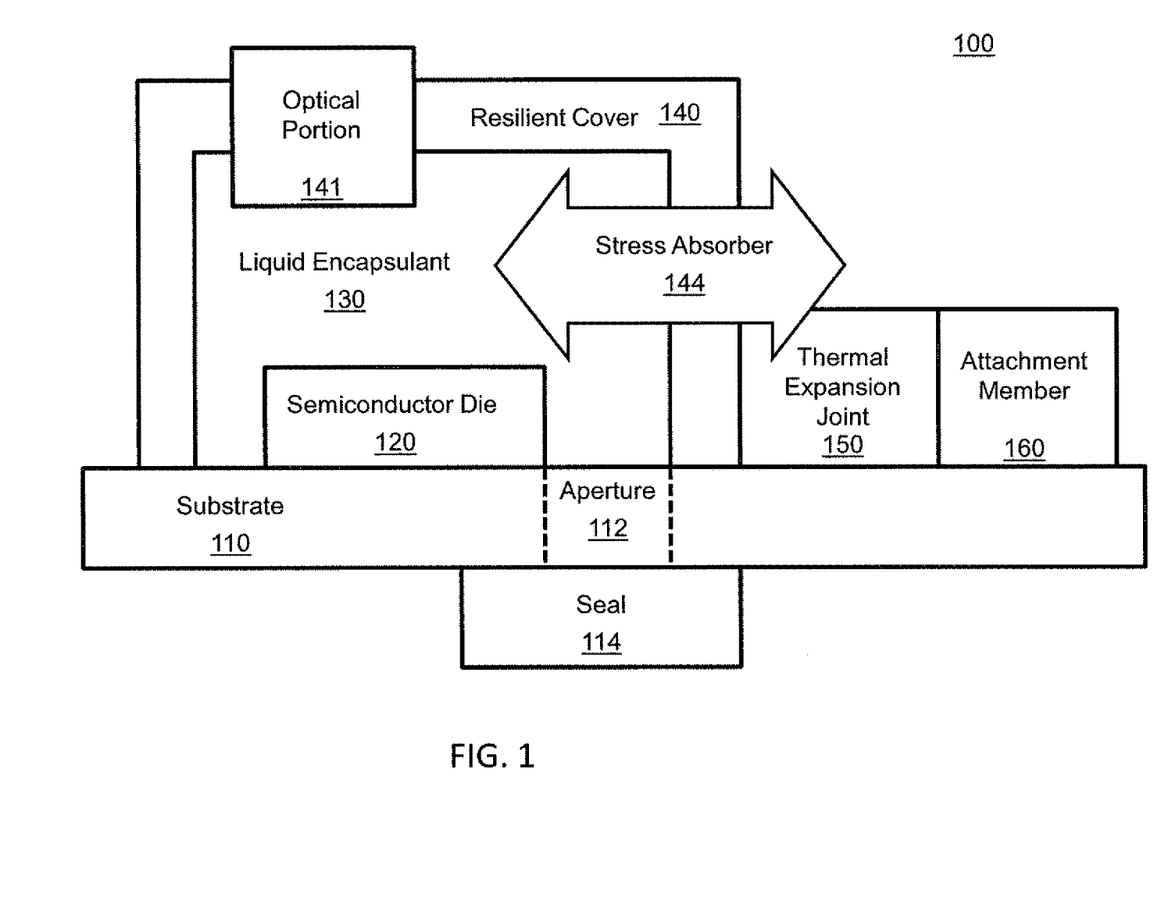
FIG. 1 illustrates a block diagram of a light source having a liquid encapsulant.

FIG. 1 illustrates a block diagram of a light source 100. The light source 100 may comprise a substrate 110, a die 120, a liquid encapsulant 130, a resilient cover 140, a thermal expansion joint 150 and an attachment member 160. The substrate 110 may be a printed circuit board (referred hereinafter as "PCB") or a lead frame molded structure to provide support for the die 120. The die 120 may be a semiconductor die configured to emit light or any other radiation, which may be visible or invisible to human eyes. The die 120 may be disposed on the substrate 110. The die 120 may be surrounded by a liquid encapsulant 130, which may be arranged to substantially encapsulate the die 120. The substrate 110 may comprise an aperture 112 providing access to the liquid encapsulant 130. The liquid encapsulant 130 may be inserted into the space surrounding the die 120 via the aperture. The aperture 112 may be covered or otherwise sealed by a seal 114.

The liquid encapsulant 130 may be silicone oil that may be any liquid polymerized siloxane with organic side chains. The liquid encapsulant 130 may be formed with a backbone of alternating silicon-oxygen atoms, rather than carbon atoms. Other species attached to the tetravalent silicon atoms, not to the divalent oxygen atoms, which are fully committed to forming the siloxane chain. The liquid encapsulant 130 may be excellent electrical insulators and non-flammable. In another embodiment, the liquid encapsulant may be mineral oil, or any other similar liquid encapsulant that may be substantially transparent and substantially electrically isolative. The mineral oil may be transparent, colorless oil composed mainly of alkanes and cyclic paraffin that may be used as a non-conductive coolant or thermal fluid while functioning as a light transmission medium.

The resilient cover 140 may comprise substantially silicone, polycarbonate, polymethyl methacrylate or other polymer material that may be stretchable, and elastic. In the embodiment shown in FIG. 1, the resilient cover 140 may be substantially transparent but in other embodiments where the resilient cover 140 may be configured to diffuse light, the resilient cover 140 may not be substantially transparent and may appear white in color.

The resilient cover 140 may be attached to the substrate 110 so as to hold the liquid encapsulant 130 surrounding the die 120. The attachment member 160 may be employed to secure a portion of the resilient cover 140 onto the substrate 110. Other portion of the resilient cover 140 may remain flexible and easily stretchable so as to absorb size increment of the liquid encapsulant 130, which may be due to thermal expansion. In the embodiment shown in FIG. 1, the resilient cover 140 may be made from silicone rather than other candidates such as polycarbonate or polymethyl methacrylate, since the silicone may provide a more resilient and/or more elastic property.

The resilient cover 140 may further comprise a stress absorber 144 and an optical portion or a lens portion 141. The optical portion 141 may be a lens having a substantially dome shape for collimating or directing light. The shape and/or size of the lens portion 141 may be substantially retained as changes of size or shape may have an optical effect on the characteristic of the light source 100. The stress absorber 144 may be a portion of the resilient cover 140 outside the lens portion 141 that may be more easily stretchable and compressible relative to other portion of the resilient cover 140, in particular the lens portion 141. In other words, the stress absorber 144 of the resilient cover 140 may be configured to expand or contract according to the liquid encapsulant 130 while the resilient cover 140 may configured to retain its shape substantially independent of ambient temperature or temperature of the light source 100.

In addition to the stress absorber 144, the light source 100 may further comprise a thermal expansion joint 150. The thermal expansion joint 150 may be an additional structure formed on the resilient cover 140. The thermal expansion joint 150 may be arranged adjacent to the lens portion 141 so as to absorb thermal expansion of the liquid encapsulant 130 such that shape and size of the lens portion 141 of the resilient cover 140 may be substantially retained when ambient temperature or temperature of the light source 100 changes. This arrangement of having the thermal expansion joint 150 and the stress absorber 144 may be advantageous for reducing mechanical stress on the package of the light source 100 caused by thermal expansion and thus, may contribute towards increasing the reliability performance.

Figure 2A:
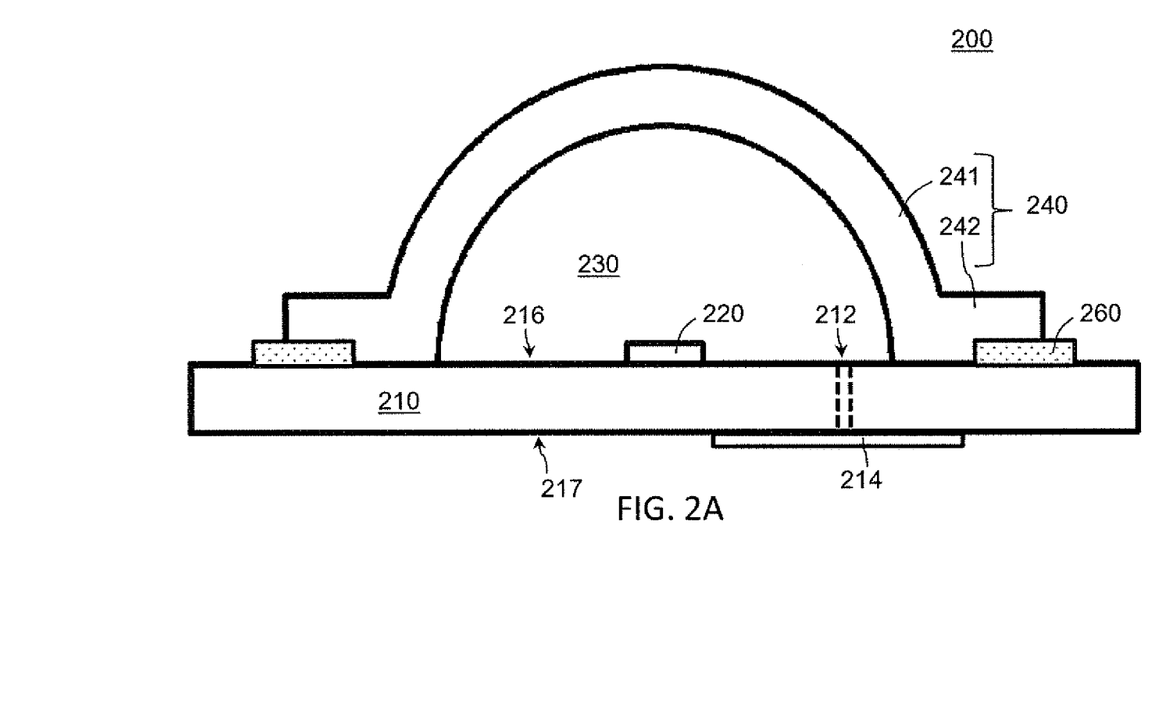
FIG. 2A illustrates a cross-sectional view of a light source having a liquid encapsulant.
Figure 2B:
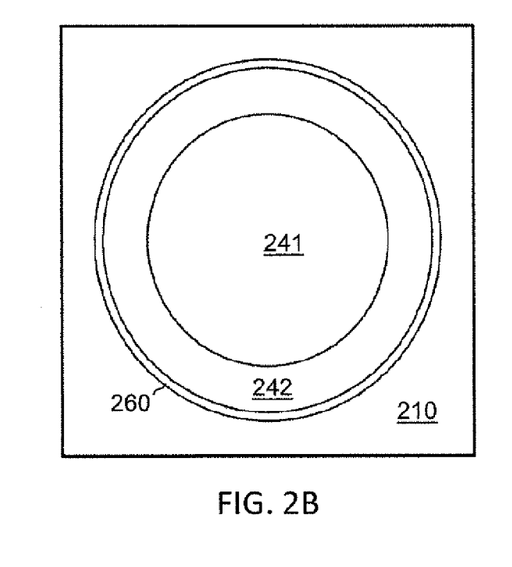
FIG. 2B illustrates a top view of the light source shown in FIG. 2A.
Figure 2C:
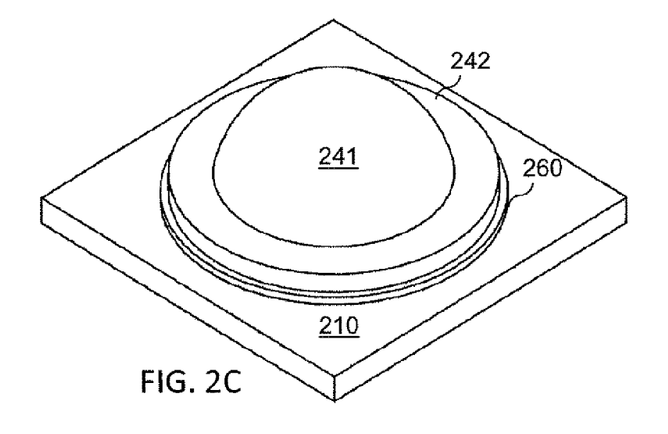
FIG. 2C illustrates a perspective view of the light source shown in FIG. 2A.
Figure 2D:
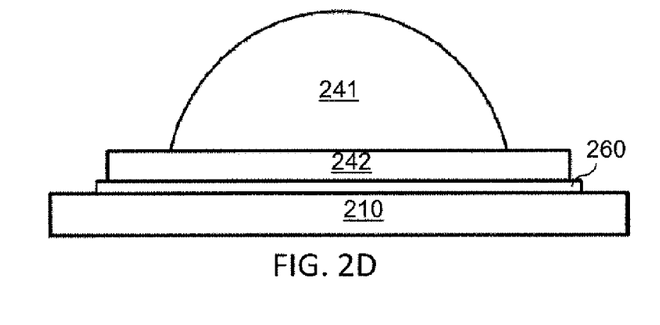
FIG. 2D illustrates a side view of the light source shown in FIG. 2A.

FIG. 2A illustrates a cross-sectional view of a light source 200. Various views of the light source 200 are shown in FIGS. 2B-2C. More specifically, FIG. 2B illustrates a top view; FIG. 2C illustrates a perspective view; and FIG. 2D illustrates a side view of the light source 200. The light source 200 may comprise a substrate 210, a die 220, a liquid encapsulant 230, a resilient cover 240 and an attachment member 260. The substrate 210 may comprise an aperture 212 that may be covered by a seal 214. The substrate 210 may comprise a component side 216 for receiving the die 220 and an opposing side 217 opposing the component side 216. As shown in FIG. 2A, the resilient cover 240 and the die 220 may be disposed on the component side 216 of the substrate 210. The resilient cover 240 may comprise a substantially flat portion 242 and a lens portion 241.

As shown in FIG. 2A, the lens portion 241 may be substantially dome shaped. The liquid encapsulant 230 may be at least partially bounded by the lens portion 241 of the resilient cover 240. The liquid encapsulant 230 may have a refraction index higher than that of air, which may be present surrounding the light source 200. The lens portion 241 having substantially dome shaped may form a convex lens to collimate light. The lens portion 241 may be substantially transparent. Alternatively, the lens portion may comprise a substance to diffuse light and may appear white in color.

In addition, the substantially flat portion 242 of the resilient cover 240 may accommodate the attachment member 260 so that the attachment member 260 may be sandwiched between the substantially flat portion 242 of the resilient cover 240 and the substrate 210. As shown in FIG. 2A, the attachment member 260 may be isolated from the liquid encapsulant 230 by a portion of the resilient cover 240 to ensure the attachment member 260 is in dry condition. The portion of the resilient cover 240 may be in direct contact to the substrate 210. The liquid encapsulant 230 may be interposed between the substrate 210 and the portion of the resilient cover 240. The attachment member 260 may be interposed and/or sandwiched between the substrate 210 and the portion of the resilient cover 240.

A substantial amount of light may exit the light source 200 through the lens portion 241 and a relatively smaller portion may be transmitted externally through the attachment member 260 and the substantially flat portion 242 of the resilient cover 240. The resilient cover 240 and the attachment member 260 may be made from similar material. In one embodiment, the attachment member 260, the resilient cover 240 and the liquid encapsulant 230 may be made from silicone. The liquid encapsulant 230 may be in liquid form but the attachment member 260 and the resilient cover 240 may be cured into substantially solid form. By using a substantially similar material of silicone, the lens profile may be simulated and shaped relatively easily to match the refractive index for optimum radiation patterns. In addition, each component made from similar material may be chemically friendly and may be neutral to each other.

As shown in FIGS. 2B-2D, the substantially flat portion 242 of the resilient cover 240 and the attachment member 260 may be arranged radially symmetrical around lens portion 241 so that the liquid encapsulant 230 may be completely sealed surrounding the die 220. The attachment member 260 may be exposed and visible externally. In one embodiment, the attachment member 260 may further comprise a dye so as to add color for decorating purpose. Similarly, the substantially flat portion 242 of the resilient cover 240 may comprise a dye so as to add color for decorating purpose. In another embodiment, the substantially flat portion 242 of the resilient cover 240 and the attachment member 260 may be arranged radially symmetrical around the die 220.

Figure 3A:
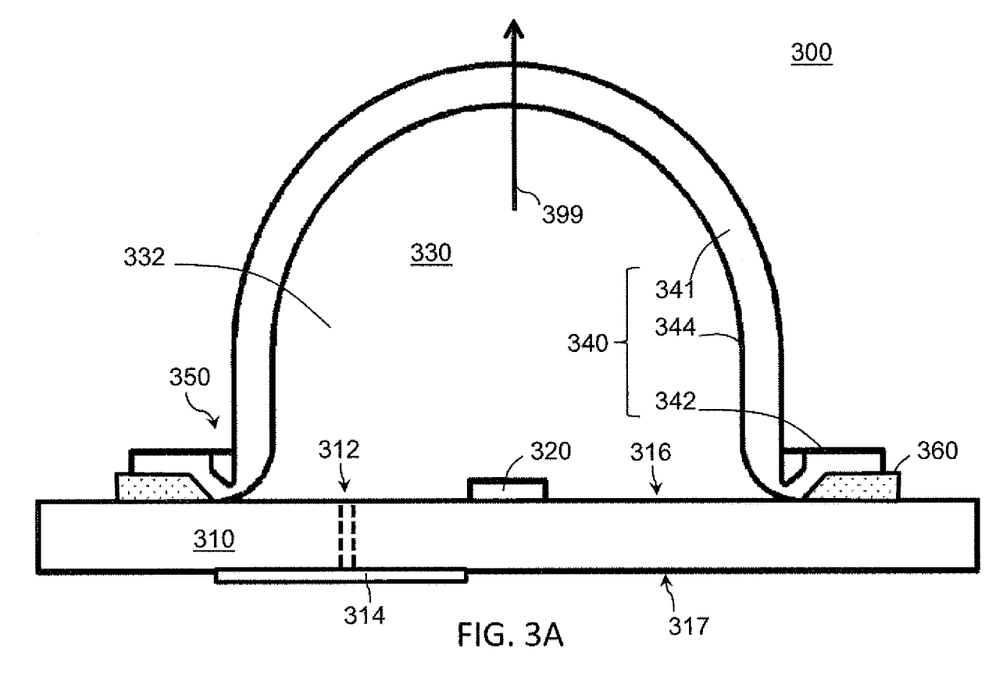
FIG. 3A illustrates a cross-sectional view of a light-emitting device having a liquid encapsulant with indentation.
Figure 3B:
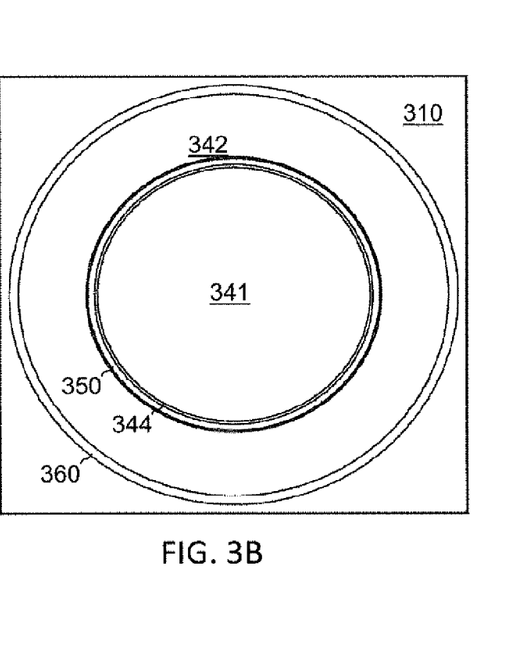
FIG. 3B illustrates a top view of the light-emitting device shown in FIG. 3A.
Figure 3C:
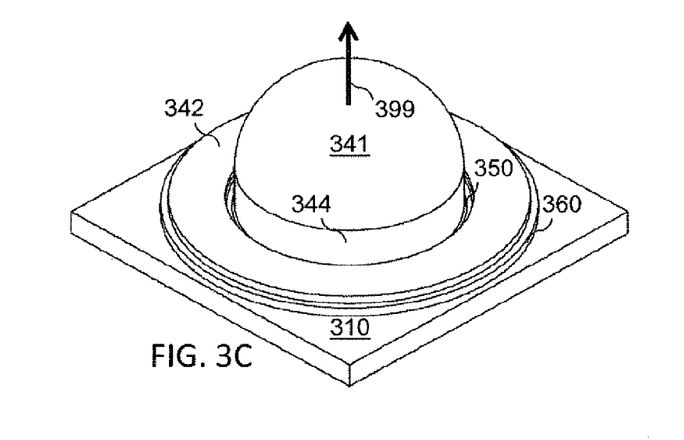
FIG. 3C illustrates a perspective view of the light-emitting device shown in FIG. 3A.
Figure 3D:
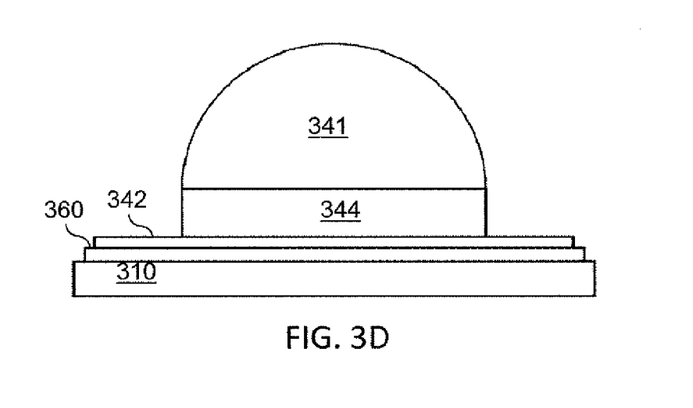
FIG. 3D illustrates a side view of the light-emitting device shown in FIG. 3A.

FIG. 3A illustrates a cross-sectional view of a light-emitting device 300. Various views of the light-emitting device 300 are shown in FIGS. 3B-3C. More specifically, FIG. 3B illustrates a top view; FIG. 3C illustrates a perspective view; and FIG. 3D illustrates a side view of the light-emitting device 300. The light-emitting device 300 may comprise a base 310, a die 320, a liquid encapsulant 330, a resilient cover 340 and an attachment member 360. The base 310 may be a PCB to provide structural support for the light-emitting device 300. The base 310 may comprise a component side 316 for receiving the die 320 and an opposing side 317 opposing the component side 316. As shown in FIG. 3A, the resilient cover 340 and the die 320 may be disposed on the component side 316 of the base 310.

At least a portion 342 of the resilient cover 340 may be attached to the base 310 to define therein a cavity 332. An aperture 312 may be formed on the base 310. The liquid encapsulant 330 may be inserted into the cavity 332 to encapsulate the die 320 through the aperture 312. After inserting the liquid encapsulant 330, the aperture 312 may be covered by a seal 314 to prevent leakages. The base 310 may further comprise an additional aperture (not shown) as air escape route to facilitate the insertion of liquid encapsulant. The additional aperture (not shown) may be sealed by a similar seal 314. In the embodiment shown in FIG. 3A, the resilient cover 340 may comprise a substantially flat portion 342, a vertical portion 344 and a substantially dome shaped portion 341. The vertical portion 344 may be adjoining the substantially dome shaped portion 341 and the substantially flat portion 342. The substantially dome shaped portion 341 of the resilient cover 340 may be configured to hold the liquid encapsulant 330. In addition, the substantially dome shaped portion 341 of the resilient cover 340 may be configured to define the shape of the liquid encapsulant 330, which is in liquid form having indefinite shape.

For this purpose, at least a portion of the resilient cover 340 may be secured on the base 310 through the attachment member 360. In the embodiment shown in FIG. 3A, the substantially flat portion 342 of the resilient cover 340 may be secured to the base 310 such that the attachment member may be sandwiched between the substantially flat portion 342 of the resilient cover 340 and the base 310. In addition, the attachment member 360 may be a sealant preventing the liquid encapsulant 330 from leaking externally. The attachment member 360 and the flat portion 342 may be configured to conceal the liquid encapsulant 330 within the cavity 332. As shown in FIG. 3B, the attachment member 360 may be radially symmetrical along a center axis 399.

The die 320 disposed on the base 310 may be a light source die configured to emit light. The die 320 may be a semiconductor die or any other die adaptable to convert electrical energy into light or a radiation (visible or invisible) to human eyes. In one embodiment, the die 320 may be an LED die configured to emit light. The die 320 may further comprise a wavelength converting material such as phosphor to produce white light.

The liquid encapsulant 330 may be configured to absorb heat generated from the die 320. The liquid encapsulant 330 may contract or expand in accordance to the temperature. In order to avoid stressing the light-emitting device 300, at least a portion of the resilient cover 340 may be made easily stretchable so as to absorb size increment of the liquid encapsulant 330 due to thermal expansion. This may be achieved by using varied and/or different curing profile for the resilient cover 340. For example, after the resilient cover 340 is molded into the shape, each of the substantially dome shaped portion 341, the vertical portion 344 and the substantially flat portion 342 may be cured differently, or may be mixed with additional chemicals so that each portions have different degree of resilience.

For example, the vertical portion 344 of the resilient cover 340 may be made easily stretchable compared to the substantially dome shaped portion 341. The substantially dome shaped portion 341 of the resilient cover 340 may be more rigid compared to the vertical portion 344 and the substantially flat portion 342 of the resilient cover. With such arrangement, the vertical portion 344 may expand or contract more easily in accordance to the changes of ambient temperature or temperature of the light-emitting device 300, while that the substantially dome shaped portion 341 may substantially retain its shape.

Similarly, the substantially flat portion 342 of the resilient cover 340 may be made easily stretchable compared to the substantially dome shaped portion 341. In other words, the portions of the resilient cover 340 that may be less sensitive and less susceptible to optical performance may be made more resilient and more easily stretchable, whereas the portions of the resilient cover that may be more sensitive and more susceptible to optical performance may be made more rigid to retain its size and shape.

The resilient cover 340 may further comprise a thermal expansion joint 350. The thermal expansion joint 350 may comprise in substantial portion an indentation 350 adjacent to the substantially flat portion 342 of the resilient cover 340. The indentation 350 may be formed on the resilient cover 340 between the attachment member 360 and the substantially dome shaped portion 341 of the resilient cover 340 to provide space for thermal expansion such that the substantially dome shaped portion 341 of the resilient cover 340 may remain substantially secured, and retained its size and shape. As shown in FIG. 3A, the attachment member 360 may be spaced apart from the liquid encapsulant 330 with the thermal expansion joint 350 disposed between the liquid encapsulant 330 and the attachment member 360.

Figure 3E:
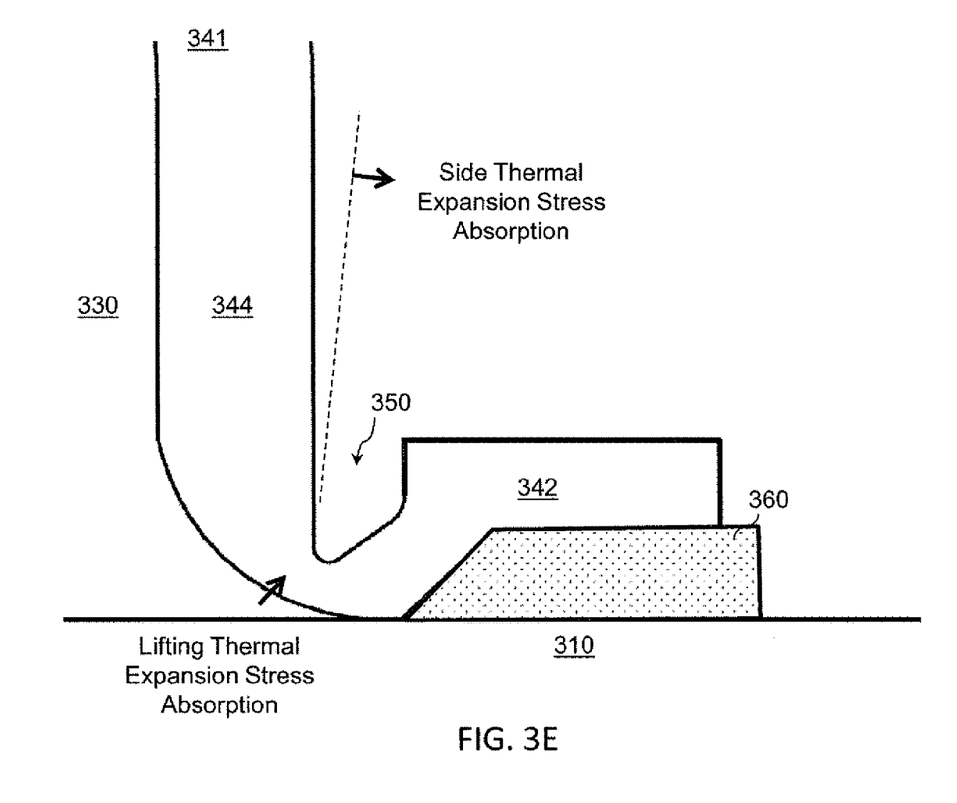
FIG. 3E illustrates absorption of thermal expansion.

In addition, the thermal expansion joint 350 may be substantially radially symmetrical around the center axis 399 as shown in FIGS. 3B-3D. FIG. 3E illustrates absorption of thermal expansion using the thermal expansion joint 350. When the liquid encapsulant 330 increases in size due to thermal expansion, a side thermal expansion stress and a lifting thermal expansion stress may occur. However, the indentation or the thermal expansion joint 350 may be configured to provide space to absorb the side thermal expansion and the lifting thermal expansion, retaining the overall size and shape of the resilient cover 340.

Figure 4A:
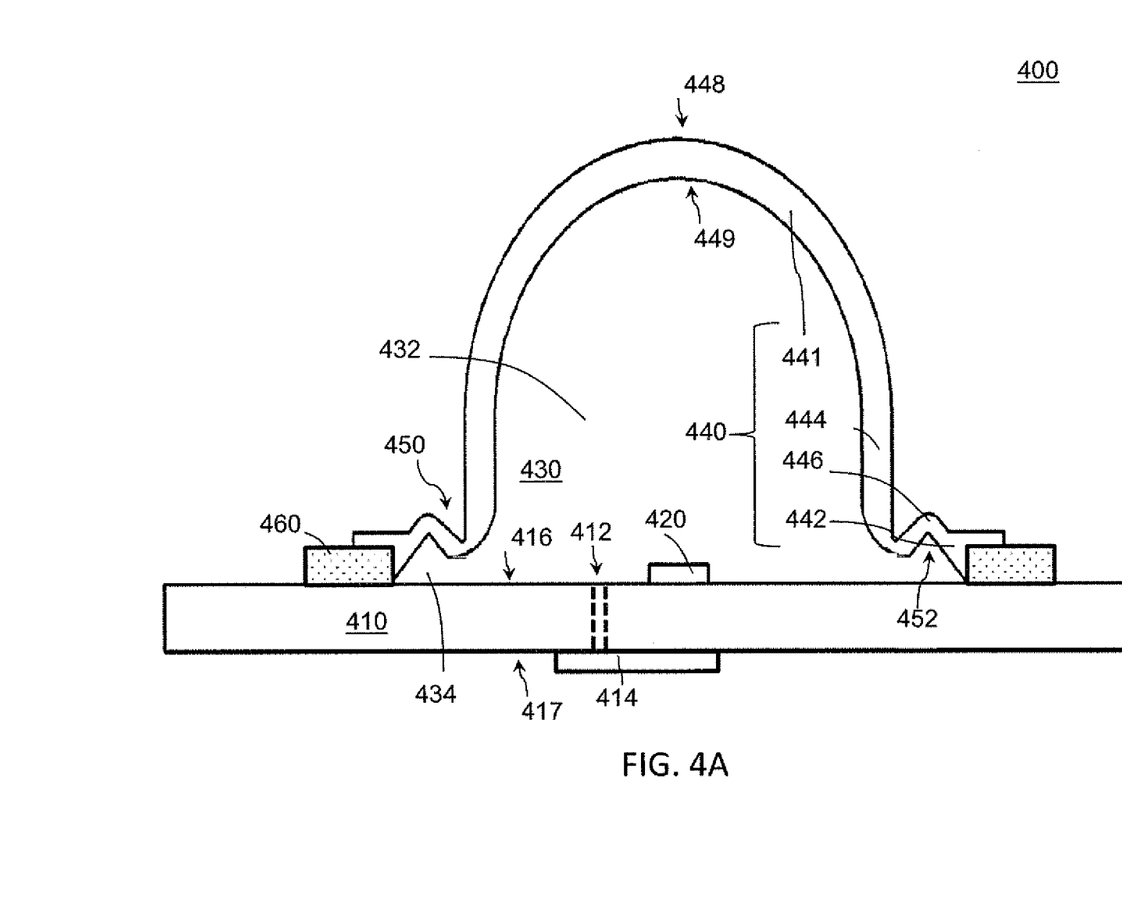
FIG. 4A illustrates a cross-sectional view of a lighting apparatus having a liquid encapsulant with multiple indentations.
Figure 4B:
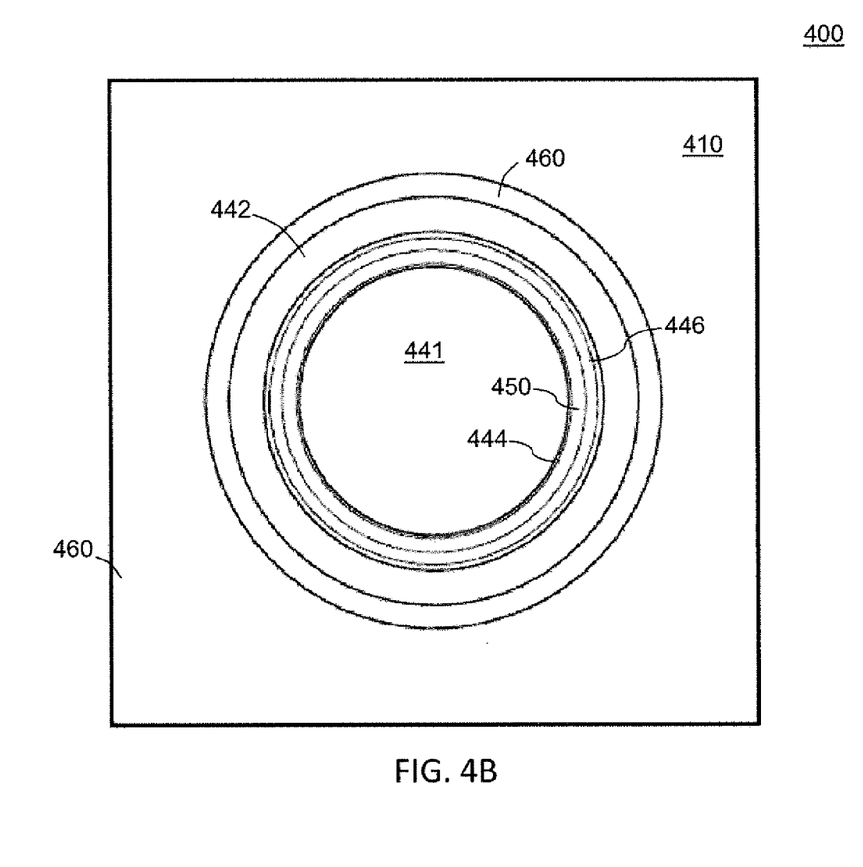
FIG. 4B illustrates a top view of the lighting apparatus shown in FIG. 4A.
Figure 4C:
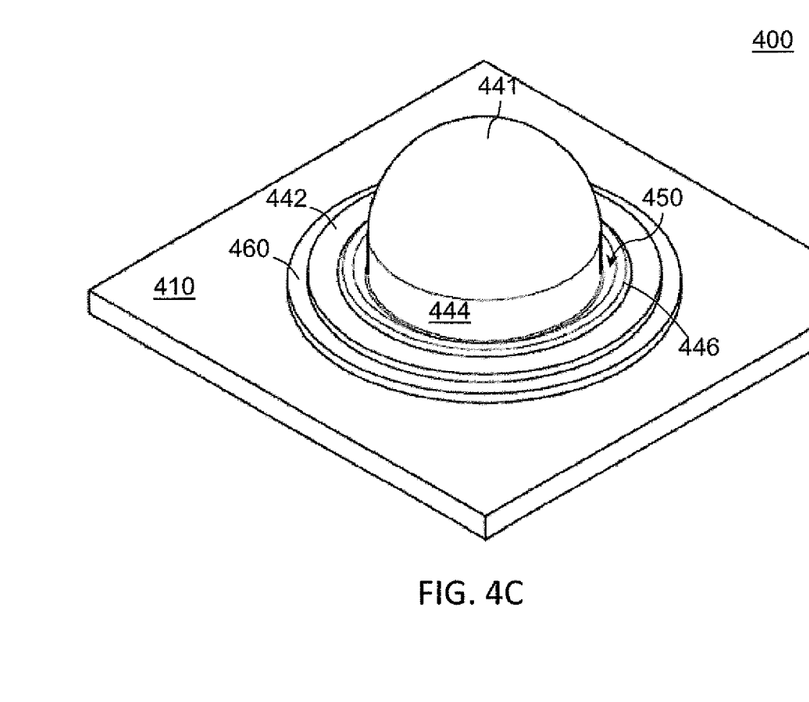
FIG. 4C illustrates a perspective view of the lighting apparatus shown in FIG. 4A.
Figure 4D:
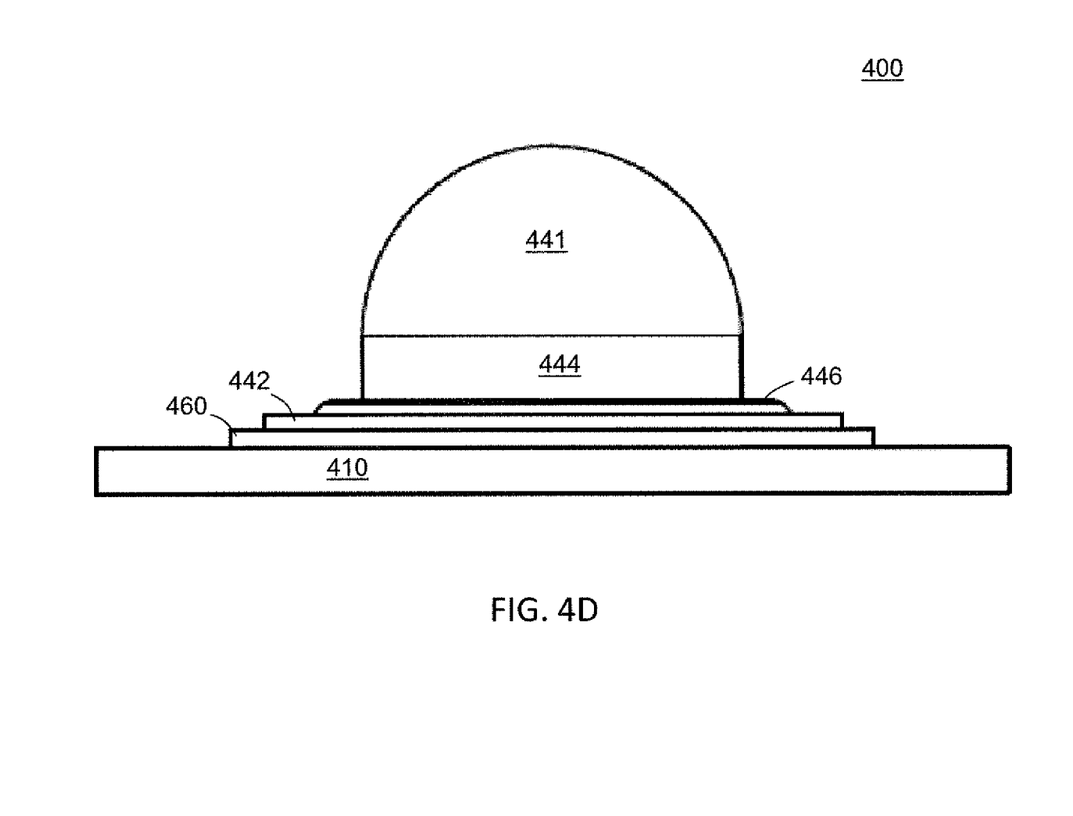
FIG. 4D illustrates a side view of the lighting apparatus shown in FIG. 4A.

FIG. 4A illustrates a cross-sectional view of a lighting apparatus 400. Various views of the lighting apparatus 400 are shown in FIGS. 4B-4C. More specifically, FIG. 4B illustrates a top view; FIG. 4C illustrates a perspective view; and FIG. 4D illustrates a side view of the lighting apparatus 400. The lighting apparatus 400 may comprise a base 410, a die 420, a liquid encapsulant 430, a resilient cover 440 and an attachment member 460. The base 410 may be a PCB to provide structural support for the lighting apparatus 400. The base 410 may comprise a component side 416 for receiving the die 420 and an opposing side 417 opposing the component side 416. As shown in FIG. 4A, the resilient cover 440 and the die 420 may be disposed on the component side 416 of the base 410.

The lighting apparatus 400 may further comprise a cavity 432 defined therein between the resilient cover 440 and the component side 416 of the base 410. As shown in FIG. 4A, the cavity 432 may be substantially dome shaped as defined by the resilient cover 440. Optionally, the base 410 may comprise an aperture 412 providing access to the cavity 432. The aperture 412 may be sealed by a sealant 414 sealing the aperture 412 on the opposing side 417 of the base 410. The liquid encapsulant 430 may be disposed within the cavity 432 encapsulating the die 420. The attachment member 460 may be configured to seal the resilient cover 440 onto the component side 416 of the base 410 such that the liquid encapsulant 430 may be retained within cavity 432.

Similar to the previously illustrated embodiments, at least a portion of the resilient cover 440 may be made easily stretchable so as to absorb size increment of the liquid encapsulant 430, which may be due to thermal expansion. As shown in FIG. 4A, the resilient cover 440 may comprise a substantially dome shaped portion 441, a substantially flat portion 442, a vertical portion 444 and a thermal expansion joint portion 450, 452. The thermal expansion join portion 450, 452 may comprise at least one indentation 450.

In the embodiment shown in FIG. 4A, the thermal expansion joint portion 450, 452 may comprise a first indentation 450 and a second indentation 452. The first indentation 450 may be formed on an external surface 448 of the resilient cover 440, whereas the second indentation 452 may be formed on an internal surface 449 the resilient cover 440. The arrangement of having the first indentation 450 and the second indentation 452 formed on the external surface 448 and the internal surface 449 respectively may be advantageous for better absorption of thermal expansion stress that may originate from the internal surface 449 or the external surface 448.

The resilient cover 440 may comprise more than one indentation 452 formed on the internal surface 449 and more than one indentation 450 formed on the external surface 448 in another embodiment. In yet another embodiment where the resilient cover 440 may comprise a plurality of first indentations 450 formed on the external surface 448 and a plurality of second indentations 452 formed on the internal surface 449, the plurality of first indentations 450 may be arranged interlacing the plurality of second indentations 452.

As shown in FIG. 4A, the resilient cover 440 may further comprise a concave portion 446 adjoining the first indentation 450 and the second indentation 452. The concave portion 446 of the resilient cover 440 may define an additional cavity 434 adjacent to the cavity 432. The concave portion 446 may be formed more rigid compared to any other portion of the resilient cover 440 and may be configured as leaf spring to retain the shape of the substantially dome shaped cavity 430.

Referring to FIG. 4B and FIG. 4C, the first and second indentations 450, 452 may be arranged substantially concentric adjacent to each other with the substantially dome shape portion 441 arranged in the center. Similarly, the concave portion 446 and the flat portion 442 may be arranged substantially concentric to each other.

Figure 5:
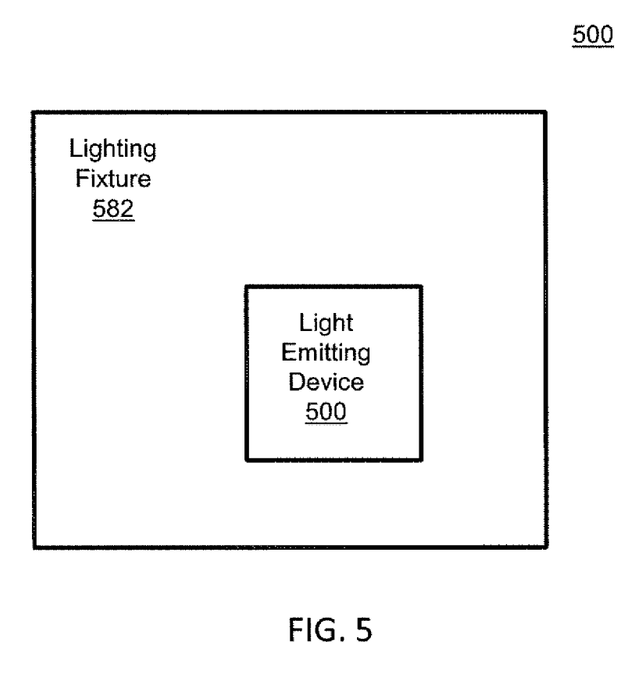
FIG. 5 illustrates a block diagram of a lighting fixture.

FIG. 5 illustrates a block diagram of a lighting fixture 582. The lighting fixture 582 may comprise a light-emitting device 500. The light-emitting device 500 may be the light source 100, the light source 200, the light-emitting device 300 or the lighting apparatus 400 illustrated above. The teaching regarding the light source 100, the light source 200, the light-emitting device 300 and the lighting apparatus 400 may be applicable to a package for light source.

Figure 6:
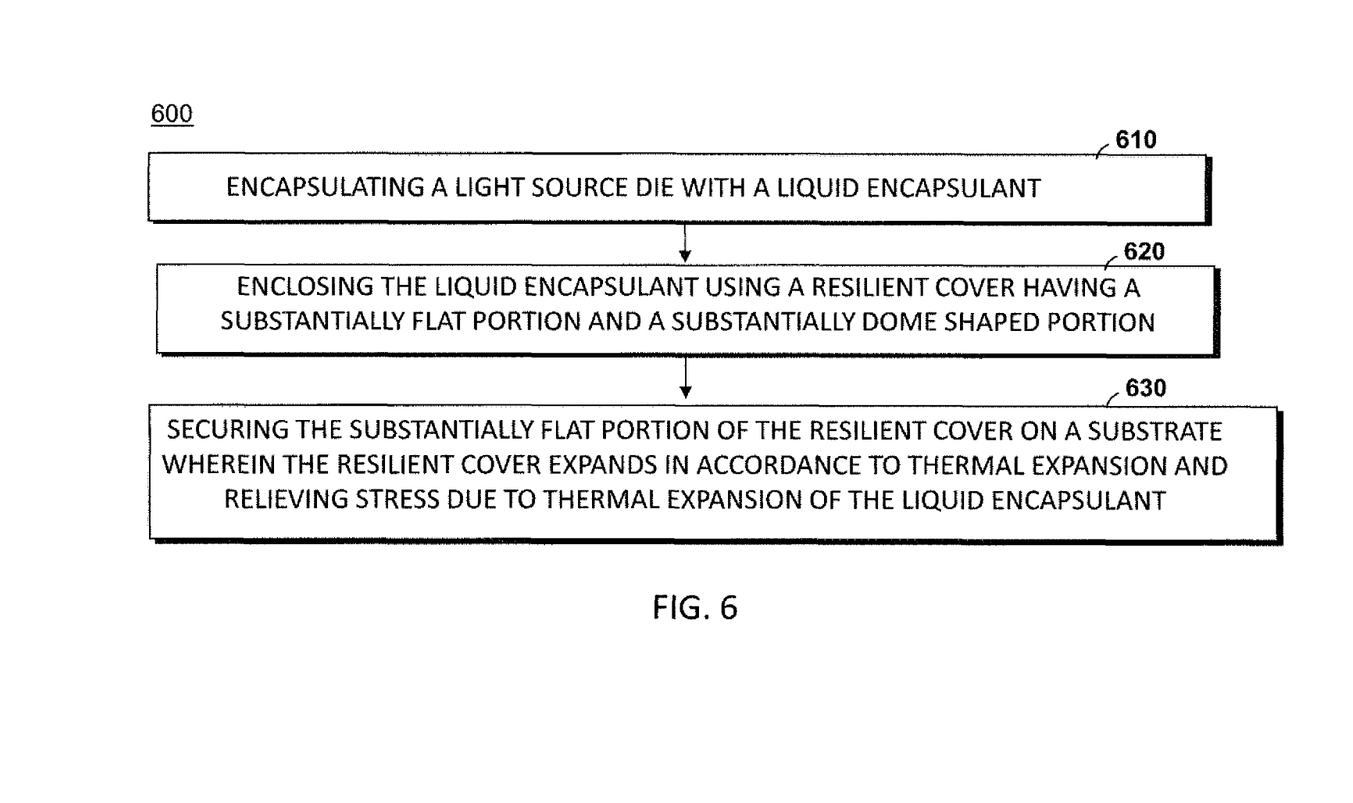
FIG. 6 illustrates a flow chart showing a method for substantially avoiding stress accumulation of a light source.

FIG. 6 illustrates a flow chart 600 showing a method for substantially avoiding stress accumulation of a light source. In step 610, a light source die may be encapsulated with a liquid encapsulant. In step 620, the liquid encapsulant may be enclosed using a resilient cover. The resilient cover may comprise a substantially flat portion and a substantially dome shaped portion. In step 630, the substantially flat portion of the resilient cover may be secured on a substrate. The resilient cover may expand or contract in accordance to thermal expansion and relieving stress due to thermal expansion of the liquid encapsulant.

Different aspects, embodiments or implementations may, either individually and/or in combination, but need not, yield one or more of the following advantages. For example, the arrangement of the vertical portion, thermal joints, first and second indentations may be advantageous for absorbing stress due to thermal expansion. Although different aspects have been presented in each embodiment, all or part of the different aspects illustrated in each embodiment may be combined. For example, the material for liquid encapsulant and the resilient cover are described in details in the embodiment shown in FIG. 1 may be applicable to all other embodiments shown in the specification. Similarly, the first and second indentations illustrated in the embodiment shown in FIGS. 4A-4B may be applicable to all other embodiments.

Various embodiments of the invention are contemplated in addition to those disclosed hereinabove. Although specific embodiments of the invention have been described and illustrated, the invention is not to be limited to the specific forms or arrangements of parts so described and illustrated. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention. It is to be understood that the illustration and description shall not be interpreted narrowly.

What is claimed is:

1. A light source, comprising:
   a substrate;
   a die disposed on the substrate;
   a liquid encapsulant surrounding the die;
   a resilient cover configured to hold the liquid encapsulant; and
   an attachment member to secure a portion of the resilient cover onto the substrate, wherein at least a portion of the resilient cover is stretchable so as to absorb size increment of the liquid encapsulant due to thermal expansion.

2. The light source of claim 1, wherein the substrate comprises an aperture providing access to the liquid encapsulant.

3. The light source of claim 2 further comprising a seal covering the aperture.

4. The light source of claim 1, the resilient cover comprises a lens portion, and a thermal expansion joint arranged adjacent to the lens portion to absorb thermal expansion of the liquid encapsulant such that shape and size of lens portion of the resilient cover is substantially retained when temperature changes.

5. The light source of claim 1, wherein the liquid encapsulant is silicone oil.

6. The light source of claim 1, wherein the resilient cover has a stress absorber that is more easily stretchable and compressible relative to other portion of the resilient cover.

7. The light source of claim 1, wherein the liquid encapsulant is at least partially bounded by a substantially dome shaped portion of the resilient cover and wherein the substantially dome shaped portion substantially forms a convex lens.

8. The light source of claim 1, wherein the resilient cover has a substantially flat portion to accommodate the attachment member so that the attachment member is sandwiched between the substantially flat portion of the resilient cover and the substrate.

9. A light-emitting device, comprising:
   a base;
   a die disposed on base;
   a liquid encapsulant encapsulating the die;
   a resilient cover configured to hold the liquid encapsulant, the resilient cover having a substantially dome shaped portion and a substantially flat portion; and
   an attachment member configured to secure the substantially flat portion of the resilient cover onto the base,
   wherein at least a portion of the resilient cover is stretchable so as to absorb size increment of the liquid encapsulant due to thermal expansion.

10. The light-emitting device of claim 9, wherein the resilient cover comprises an indentation providing space for thermal expansion such that the substantially dome shaped portion of the resilient cover remained substantially secured.

11. The light-emitting device of claim 9, wherein the resilient cover further comprises a thermal expansion joint.

12. The light-emitting device of claim 11, wherein the thermal expansion joint is substantially radially symmetrical around a center axis.

13. The light-emitting device of claim 11, wherein the attachment member is spaced apart from the liquid encapsulant with the thermal expansion joint disposed between the liquid encapsulant and the attachment member.

14. The light-emitting device of claim 9, wherein the resilient cover further comprises a vertical portion adjoining the substantially dome shaped portion and the substantially flat portion.

15. The light-emitting device of claim 14, wherein the substantially dome shaped portion of the resilient cover is more rigid compared to the vertical portion and the substantially flat portion of the resilient cover such the vertical portion expands or contracts in accordance to changes of temperature while that the substantially dome shaped portion retains its shape.

16. The light-emitting device of claim 9, wherein the attachment member comprises a sealant preventing the liquid encapsulant from leaking externally.

17. A lighting apparatus, comprising:
a base, the base having a component side;
a die disposed on the component side of the base;
a resilient cover disposed on the component side of the base;
a cavity defined therein between the resilient cover and the component side of the base;
a liquid encapsulant disposed within the cavity encapsulating the die; and
an attachment member configured to seal the resilient cover onto the component side of the base such that the liquid encapsulant is retained within cavity,
wherein at least a portion of the resilient cover is stretchable so as to absorb size increment of the liquid encapsulant due to thermal expansion.

18. The lighting apparatus of claim 17, wherein the resilient cover comprises a substantially dome shaped portion, a substantially flat portion and a thermal expansion joint portion.

19. The lighting apparatus of claim 18, wherein the thermal expansion joint portion comprises a first indentation and a second indentation.

20. The lighting apparatus of claim 19, wherein the first indentation is formed on an external surface of the resilient cover, and wherein the second indentation is formed on an internal surface.

* * * * *